United States Patent
Furuhata et al.

(10) Patent No.: US 6,717,204 B1
(45) Date of Patent: Apr. 6, 2004

(54) SEMICONDUCTOR DEVICES HAVING A NON-VOLATILE MEMORY TRANSISTOR

(75) Inventors: Tomoyuki Furuhata, Sakata (JP); Atsushi Yamazaki, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/604,702

(22) Filed: Jun. 23, 2000

(30) Foreign Application Priority Data

Jun. 23, 1999 (JP) .......................................... 11-177146

(51) Int. Cl.$^7$ .................... H01L 29/788; H01L 21/8247

(52) U.S. Cl. ........................ 257/316; 438/258; 257/500

(58) Field of Search ................................ 438/257–267; 257/315–321, 500

(56) References Cited

U.S. PATENT DOCUMENTS

| | | | |
|---|---|---|---|
| 4,651,406 A | * 3/1987 | Shimizu et al. | |
| 5,045,488 A | 9/1991 | Yeh | 437/43 |
| 5,108,941 A | 4/1992 | Paterson et al. | 437/47 |
| 5,153,143 A | * 10/1992 | Schlais et al. | |
| 5,242,848 A | 9/1993 | Yeh | 437/43 |
| 5,278,087 A | 1/1994 | Jenq | 437/43 |
| 5,309,371 A | 5/1994 | Shikata et al. | 364/491 |
| 5,378,919 A | 1/1995 | Ochiai | 257/204 |
| 5,379,253 A | 1/1995 | Bergemont | 365/185 |
| 5,557,122 A | 9/1996 | Shrivastava et al. | 257/309 |
| 5,572,054 A | 11/1996 | Wang et al. | 257/322 |
| 5,604,150 A | 2/1997 | Mehrad | 437/70 |
| 5,650,344 A | 7/1997 | Ito et al. | 437/40 |
| 5,652,450 A | 7/1997 | Hirano | 257/323 |
| 5,654,577 A | 8/1997 | Nakamura et al. | 257/392 |
| 5,674,762 A | * 10/1997 | See et al. | |
| 5,677,867 A | 10/1997 | Hazani | 365/185 |
| 5,687,118 A | 11/1997 | Chang | 365/185.19 |
| 5,712,178 A | * 1/1998 | Cho et al. | |
| 5,748,536 A | 5/1998 | Kwon et al. | 365/185.25 |

(List continued on next page.)

FOREIGN PATENT DOCUMENTS

| | | | |
|---|---|---|---|
| JP | 3-219496 | 9/1991 | ........... G11C/16/06 |
| JP | 7-142617 | 6/1995 | ....... H01L/21/8247 |
| JP | 7-147336 | 6/1995 | ....... H01L/21/8247 |
| JP | 9-321156 | 12/1997 | ....... H01L/21/8247 |
| JP | 9-321157 | 12/1997 | ....... H01L/21/8247 |
| JP | 11-074389 | 3/1999 | ....... H01L/21/8247 |
| JP | 2000-188344 | 7/2000 | ....... H01L/21/8247 |

OTHER PUBLICATIONS

U.S. Ser. No. 09/602,535 (filed Jun. 23, 2000).
U.S. Ser. No. 09/602,766 (filed Jun. 23, 2000).
U.S. Ser. No. 09/599,477 (filed Jun. 23, 2000).
U.S. Ser. No. 09/663,258 (filed Sep. 15, 2000) and pending claims.

*Primary Examiner*—Richard A. Booth
(74) *Attorney, Agent, or Firm*—Konrad Raynes & Victor, LLP; Alan S. Raynes

(57) ABSTRACT

Embodiments include a semiconductor device having a non-volatile memory transistor, the semiconductor device including a plurality of field effect transistors operated at a plurality of different voltage levels. The semiconductor device has a memory region 4000, and first second and third transistor regions 1000, 2000 and 3000 respectively including field effect transistors that operate at different voltage levels. The memory region 4000 includes a split-gate non-volatile memory transistor 400. The first transistor region 1000 includes a first voltage-type transistor 100 that operates at a first voltage level. The second transistor region 2000 includes a second voltage-type transistor 200 that operates at a to second voltage level. The third transistor region 3000 includes a third voltage-type transistor that operates at a third voltage level. The second voltage-type transistor 200 has a gate insulation layer 22 that is formed from at least two insulation layers 22a and 22b. The insulation layer 22b is formed in the same step in which a gate insulation layer 20 of the first voltage-type transistor 100 is formed.

29 Claims, 15 Drawing Sheets

U.S. PATENT DOCUMENTS

| | | | |
|---|---|---|---|
| 5,907,172 A | 5/1999 | Sheu | 257/317 |
| 5,908,311 A * | 6/1999 | Chi et al. | 438/258 |
| 5,914,514 A | 6/1999 | Dejenfelt et al. | 257/322 |
| 5,939,749 A | 8/1999 | Taketa et al. | 257/316 |
| 5,969,383 A | 10/1999 | Chang et al. | 257/316 |
| 6,004,847 A | 12/1999 | Clementi et al. | 438/258 |
| 6,015,984 A | 1/2000 | Leu | 257/298 |
| 6,017,795 A | 1/2000 | Hsieh et al. | 438/262 |
| 6,043,123 A * | 3/2000 | Wang et al. | 438/258 |
| 6,090,656 A | 7/2000 | Randazzo | 438/239 |
| 6,103,573 A | 8/2000 | Harari et al. | 438/257 |
| 6,144,064 A | 11/2000 | Cho et al. | 257/321 |
| 6,157,060 A | 12/2000 | Kerber | 257/316 |
| 6,184,093 B1 | 2/2001 | Sung | 438/275 |
| 6,194,269 B1 * | 2/2001 | Sung et al. | 438/258 |
| 6,242,773 B1 | 6/2001 | Thomas | 257/315 |

* cited by examiner

US 6,717,204 B1

SEMICONDUCTOR DEVICES HAVING A NON-VOLATILE MEMORY TRANSISTOR

U.S. Pat. No. 6,429,073 is hereby incorporated by reference in its entirety. U.S. Pat. No. 6,522,587 is hereby incorporated by reference in its entirety. Japanese patent application no. 11-177146, filed Jun. 23, 1999, is hereby incorporated by reference in its entirety.

The copending and commonly assigned patent application entitled "Methods for Manufacturing Semiconductor Devices Having a Non-Volatile Memory Transistor", with Tomoyuki Furuhata and Atsushi Yamazaki listed as inventors, is hereby incorporated by reference in its entirety. The copending and commonly assigned patent application entitled "Non-Volatile Semiconductor Memory Devices", with Tomoyuki Furuhata and Atsushi Yamazaki listed as inventors, is hereby incorporated by reference in its entirety. Japanese patent application no. 11-177146, filed Jun. 23, 1999, is hereby incorporated by reference in its entirety.

TECHNICAL FIELD

The present invention relates to semiconductor devices having a non-volatile memory transistor with a split-gate structure and includes a semiconductor device comprising a plurality of field effect transistors having different operation voltages.

BACKGROUND

In recent years, a mixed-mounting of various circuits has been utilized in view of various demands such as a shortened chip-interface delay, a lowered cost per circuit board, a lowered cost in design and development of a circuit board and the like. A mixed-mounting technology for mounting memory and logic has become one of the important technologies. However, such a mixed-mounting technology presents problems that result in complex processes and higher costs for manufacturing ICs.

SUMMARY

Certain embodiments relate to a semiconductor device comprising a memory region including a split-gate non-volatile memory transistor. The device also includes a first transistor region including a first voltage-type transistor that operates at a first voltage level, a second transistor region including a second voltage-type transistor that operates at a second voltage level, and a third transistor region including a third voltage-type transistor that operates at a third voltage level. The second voltage-type transistor includes a gate insulation layer formed from at least two insulation layers.

In one aspect of certain embodiments, the second voltage-type transistor described above includes a gate insulation layer that is formed in the same step in which a gate insulation layer of the first voltage-type transistor is formed.

In another aspect of certain embodiments, the third voltage-type transistor described above includes a gate insulation layer formed from at least three insulation layers. Additionally, the third voltage-type transistor may include an insulation layer that is formed in the same step in which the gate insulation layer of the first voltage-type transistor is formed.

In yet another aspect of certain embodiments, the non-volatile memory transistor described above may include a source, a drain, a gate insulation layer, a floating gate, an intermediate insulation layer adapted to function as a tunnel insulation layer, and a control gate. The intermediate insulation layer may be formed from at least three insulation layers, with the first and second outermost layers of the three insulation layers, respectively, contacting the floating gate and the control gate. The first and second outermost layers may also be composed of insulation layers that are formed by a thermal oxidation method.

Still other embodiments related to an embedded semiconductor device, the embedded semiconductor device a plurality of semiconductor devices selected from the group consisting of a flash-memory, an SRAM memory, a RISC, an analog circuit, and an interface circuit. The plurality of semiconductor devices are embedded in an SOG. At least one of the semiconductor devices comprises a structure including a memory region including a split-gate non-volatile memory transistor and three transistor regions. The first transistor region includes a first voltage-type transistor that operates at a first voltage level. The second transistor region includes a second voltage-type transistor that operates at a second voltage level that is greater than the first voltage level. The third transistor region includes a third voltage-type transistor that operates at a third voltage level that is greater than the second voltage level. The second voltage-type transistor includes a gate insulation layer formed from at least two insulation layers.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Figure 1:
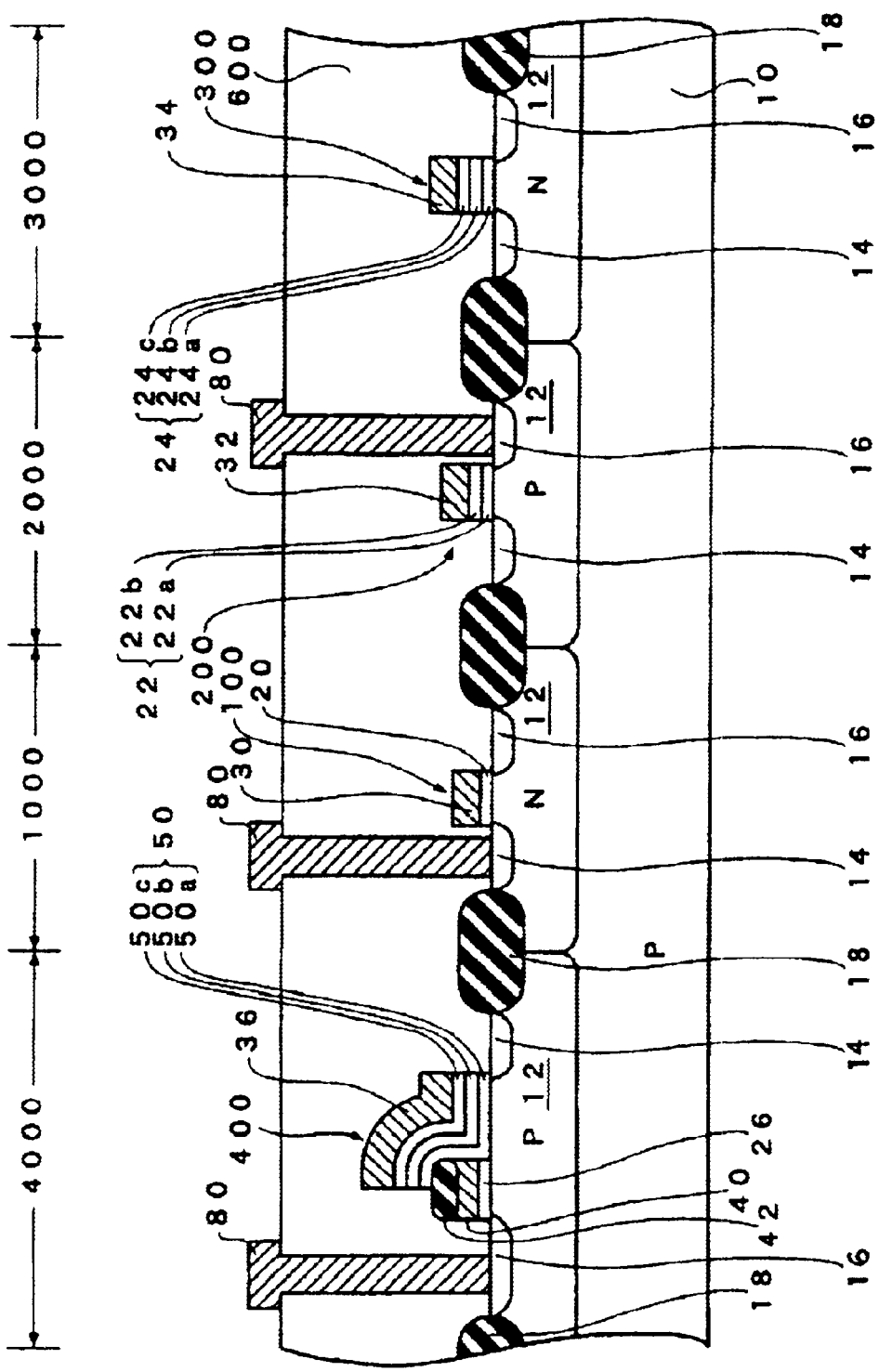
FIG. 1 is a schematic cross-sectional view of a semiconductor device in accordance with an embodiment of the present invention.

Certain embodiments of the present invention relate to methods for manufacturing a semiconductor device having highly reliable non-volatile memory transistors including field effect transistors that are operated at a plurality of different voltage levels, in which gate insulation layers of the transistors are formed by fewer and common manufacturing steps.

One embodiment of the present invention provides a semiconductor device having a non-volatile memory transistor, the semiconductor device comprising a memory region, first, second and third transistor regions including field effect transistors that operate at different voltage levels. The memory region includes a split-gate non-volatile memory transistor. The first transistor region includes a first voltage-type transistor that operates at a first voltage level. The second transistor region includes a second voltage-type transistor that operates at a second voltage level. The third transistor region includes a third voltage-type transistor that operates at a third voltage level. The second voltage-type transistor has a gate insulation layer formed from at least two insulation layers, and includes an insulation layer that is formed in the same step in which a gate insulation layer of the first voltage-type transistor is formed.

In one aspect of certain embodiments, the first through the third voltage-type transistors operate at at least three different voltage levels, i.e., the first through the third to voltage levels. Therefore, logic operable at these voltage levels can be mounted in the semiconductor device. Because of the voltage-type transistors, logic that may be required for the operation of the non-volatile memory transistors as well as other circuit regions can be mixed and mounted.

Also, the gate insulation layer of the second voltage-type transistor may be formed from at least two insulation layers, and one of the insulation layers may be formed in the same step in which the gate insulation layer of the first voltage-type transistor is formed. As a result, the number of manufacturing steps is reduced.

In addition, the third voltage-type transistor has a gate insulation layer preferably formed from at least three insulation layers, and may preferably include an insulation layer that is formed in the same step in which the gate insulation layer of the first voltage-type transistor is formed. As a result, each of the gate insulation layers of the second and the third voltage-type transistors includes an insulation layer that is formed in the same step in which the gate insulation layer of the first voltage-type transistor is formed. This further reduces the number of manufacturing steps.

The split-gate type non-volatile memory transistor may include a source, a drain, a gate insulation layer, a floating gate, an intermediate insulation layer that functions as a tunnel insulation layer and a control gate. The intermediate insulation layer may preferably be composed of at least three layers, and preferably includes first and second outermost layers that respectively contact the floating gate and the control gate, wherein the outermost layers are composed of silicon oxide layers that are formed by a thermal oxidation method. Because the outermost layers contact the floating gate and the control gate, the respective interface states stabilize. As a result, the electric charge transfer by FN conduction (Fowler-Nordheim tunneling) is stably conducted, and thus the operation of the non-volatile memory transistor stabilizes. Further, the outermost layer that contacts the control gate of the intermediate insulation layer may preferably be formed in the same step in which the gate insulation layer of the first voltage-type transistor is formed. As a result, the number of manufacturing steps is further reduced.

The gate insulation layer of the third voltage-type transistor may preferably be formed in the same step in which the intermediate insulation layer of the non-volatile memory transistor is formed. As a result, the number of manufacturing steps is further reduced.

The film thickness of the gate insulation layer of each of the voltage-type transistors may preferably be in the following ranges, in consideration of the dielectric strength of the voltage-type transistors. The gate insulation layer of the first voltage-type transistor may preferably have a film thickness of 3–13 nm. The gate insulation layer of the second voltage-type transistor may preferably have a film thickness of 4–15 nm. The gate insulation layer of the third voltage-type transistor may preferably have a film thickness of 16–45 nm.

The intermediate insulation layer of the non-volatile memory transistor may preferably have a film thickness of 16–45 nm, in consideration of the characteristics of the tunnel insulation layer. Further, the first outermost layer that forms the intermediate insulation layer of the non-volatile memory transistor may preferably have a film thickness of 5–15 nm, and the second outermost layer may preferably have a film thickness of 1–10 nm.

Each of the voltage-type transistors described above may, for example, preferably be operated at a voltage level in the following ranges: The first voltage level that operates the first voltage-type transistor is at 1.8–3.3 V in an absolute value, the second voltage level that operates the second voltage-type transistor is at 2.5–5 V in an absolute value, and the third voltage level that operates the third voltage-type transistor is at 10–15 V in an absolute value.

A semiconductor device obtained by the manufacturing method of certain embodiments of the present invention may further comprise a flash-memory (flash EEPROM), and include a memory cell array of non-volatile memory transistors and a peripheral circuit formed therein. Also, the semiconductor device may further be mixed with other circuit regions such as logic regions mounted therein. The circuit regions may include, for example, cell-base circuits, memory circuits such as ROMs and RAMs, RISC (reduced instruction set computer), IP (intellectual property) macros, and analog circuits.

The first voltage-type transistor may, for example, be included in at least one circuit selected from a group consisting of a Y-gate, sense amplifier, an input/output buffer, an X-address decoder, a Y-address decoder, an address buffer and a control circuit.

The second voltage-type transistor may, for example, be included in at least one circuit selected from a group consisting of a Y-gate, sense amplifier, an input/output buffer, an X-address decoder, a Y-address decoder and an interface circuit.

The third voltage-type transistor may, for example, be included in at least one circuit selected from a group consisting of a voltage generation circuit, an erase voltage generation circuit and a step-up voltage circuit.

FIG. 1 schematically shows a cross-sectional view of a semiconductor device including a non-volatile memory transistor in accordance with an embodiment of the present invention. The semiconductor device includes a memory region 4000, a first transistor region 1000, a second transistor region 2000 and a third transistor region 3000.

The memory region 4000 includes a non-volatile memory transistor with a split-gate structure (hereinafter referred to as "memory transistor") 400. The first transistor region 1000 includes a first voltage-type transistor 100 that operates at a first voltage level V1 (preferably 1.8–3.3 V in an absolute value). The second transistor region 2000 includes a second voltage-type transistor 200 that operates at a second voltage level V2 (preferably 2.5–5 V in an absolute value). The third transistor region 3000 includes a third voltage-type transistor 300 that operates at a third voltage level V3 (preferably 10–15 V in an absolute value). Embodiments of circuits that use the first through the third voltage-type transistors 100, 200 and 300 will be described below.

The memory transistor 400, the first voltage-type transistor 100, the second voltage-type transistor 200 and the third voltage-type transistor 300 are respectively formed in wells 12 that are formed in a P-type silicon substrate 10. The memory region 4000 and the first through the third transistor regions 1000, 2000 and 3000 are respectively isolated from one another by field insulation layers 18. Also, the transistors in the respective regions 1000 through 4000 are isolated by field insulation layers (not shown) formed in predetermined patterns. In the embodiment shown in the figure, each of the transistors is formed in each of the wells. However, when wells are not required, they may be formed in the substrate. For example, N-channel type memory transistors or N-channel type second voltage-type transistors may be formed in the substrate, but not in wells.

The first through the third transistor regions 1000, 2000 and 3000 and the memory region 4000 may respectively include N-channel type and P-channel type transistors. However, for the simplicity of description, FIG. 1 shows transistors of either one of the conductivity types.

The memory transistor 400 has a source 16 and a drain 14 composed of $N^+$ type impurity diffusion layers formed in a P-type well 12, and a gate insulation layer 26 formed on the surface of the well 12. A floating gate 40, an intermediate insulation layer 50 and a control gate 36 are formed on the gate insulation layer 26.

Further, a selective oxide insulation layer 42 is formed on the Boating gate 40. The selective oxide insulation layer 42 is formed by selective oxidation on a part of a polycrystal silicon layer that becomes the floating gate, as described below, and has a preferred structure in which the thickness thereof becomes thinner from its center toward its end sections. As a result, upper edge sections of the floating gate 40 form sharp edges, such that an electric field concentration is apt to occur at the upper edges of the floating gate 40.

The thickness of the gate insulation layer 26 of the memory transistor 400 may preferably be 6–9 nm, in consideration of the dielectric strength of the memory transistor 400.

The intermediate insulation layer 50 continues from the top surface of the selective oxide insulation film 42 to the side surface of the floating gate 40, further extends along the surface of the silicon substrate 10 and reaches one end of the source 16. The intermediate insulation layer 50 functions as what is referred to as a tunnel insulation layer. Further, the intermediate insulation layer 50 is composed of three insulation layers (silicon oxide layers), which are, in the order from the bottom, a first insulation layer 50a, a second insulation layer 50b and a third insulation layer 50c. The first and the third insulation layers 50a and 50c are composed of silicon oxide layers that are formed by a thermal oxidation method. The second insulation layer 50b is composed of a silicon oxide layer that is formed by a CVD method.

The intermediate insulation layer 50 may preferably have a film thickness of 16–45 nm, in consideration of its function as a tunnel insulation layer. The first insulation layer 50a may preferably have a film thickness of 5–15 nm, the second intermediate insulation layer 50b may preferably have a film thickness of 10–20 nm, and the third insulation layer 50c may preferably have a film thickness of 1–10 nm.

The intermediate insulation layer 50 that functions as a tunnel insulation layer has a three-layer structure, and the first insulation layer (a first outermost layer) 50a and the third insulation layer (a second outermost layer) 50c that respectively contact the floating gate 40 and the control gate 36 are preferably formed from thermal oxidation films. As a result, the interface state between the floating gate 40 and the first insulation layer 50a stabilizes, and the interface state between the control gate 36 and the third insulation layer 50c stabilizes. As a consequence, the transfer of the charge by the FN conduction from the floating gate 40 through the intermediate insulation layer 50 to the control gate 36 becomes stable, and thus the operation of the memory transistor 400 stabilizes. This contributes to an increase in the number of data writing/erasing operations (cycle life) of the memory transistor 400.

Also, because the intermediate insulation layer 50 has the second insulation layer 50b that is composed of a silicon oxide layer which is formed by a CVD method, the dielectric strength between the floating gate 40 and the control gate 36 increases. Also, malfunctions that may occur at the time of writing in or reading from memory cells, namely, write disturbs and read disturbs, can be inhibited.

The first voltage-type transistor 100, when it is a P-channel type MOS transistor, for example, has a source 16 and a drain 14 that are composed of $P^+$ type impurity diffusion layers which are formed in the N-type well 12, a first gate insulation layer 20 and a first gate electrode 30. The first voltage-type transistor 100 is preferably driven at a first voltage level V1 (1.8–3.3 V in an absolute value). The first gate insulation layer 20 may preferably have a film thickness of 3–13 nm, in consideration of the dielectric strength of the first voltage-type transistor 100.

The second voltage-type transistor 200, when it is an N-channel type MOS transistor, for example, has a source 16 and a drain 14 that are composed of $N^+$ type impurity diffusion layers which are formed in the P-type well 12, a second gate insulation layer 22 and a second gate electrode 32. The second gate insulation layer 22 is composed of two silicon oxide layers, namely, a first insulation layer 22a and a second insulation layer 22b. The second insulation layer 22b is formed in the same step in which the fist gate insulation layer 20 of the above-described first voltage-type transistor 100 is formed.

The second voltage-type transistor 200 is preferably driven at a second voltage level (2.5–5 V in an absolute value). The second gate insulation layer 22 may preferably have a film thickness of 4–15 nm, in consideration of the dielectric strength of the second voltage-type transistor 200. Also, the thickness of the first insulation layer 22a may preferably be 3–15 nm, and the thickness of the second insulation layer 22b may preferably be 1–10 nm.

The third voltage-type transistor 300, when it is a P-channel type MOS transistor, for example, has a source 16 and a drain 14 that are composed of $P^+$ type impurity diffusion layers which are formed in the N-type well 12, a third gate insulation layer 24 and a third gate electrode 34. The third gate insulation layer 24 is formed from three silicon oxide layers, which are, in the order from the bottom, a first insulation layer 24a, a second insulation layer 24b and a third insulation layer 24c. The insulation layers 24a, 24b and 24c may preferably be formed in the same steps in which the first insulation layer 50a, the second insulation layer 50b and the third insulation layer 50c that form the intermediate insulation layer 50 of the memory transistor 400 are formed, respectively.

The third voltage-type transistor 300 is preferably driven at a third voltage level V3 (10–15 V in an absolute value). The third gate insulation layer 24 may preferably have a film thickness of 16–45 nm, in consideration of the dielectric strength of the third voltage-type transistor 300. The first insulation layer 24a may preferably have a film thickness of 5–15 nm, the second insulation layer 24b may preferably have a film thickness of 10–20 nm, and the third insulation layer 24c may preferably have a film thickness of 1–10 nm.

An interlayer dielectric layer 600 is formed on the wafer in which the memory transistor 400 and the first through the third voltage-type transistors 100, 200 and 300 are formed. The interlayer dielectric layer 600 defines contact holes that reach the sources 16, the drains 14 and the gate electrode of each of the transistors 100, 200, 300 and 400. Contact conductive layers are formed in the contact holes. A wiring layer 80 having a predetermined pattern is formed on the interlayer dielectric layer 600. It is noted that FIG. 1 partially shows the contact conductive layers and wiring layers.

The semiconductor device of this embodiment has the first through the third transistor regions 1000, 2000 and 3000 in which the first through third voltage-type transistors 100, 200 and 300 that respectively operate at at least three different voltage levels (V1, V2 and V3) are formed. According to this semiconductor device, the memory transistor 400 in the memory region 4000 is operable. In the semiconductor device, not only logic for operating a flash EEPROM can be implemented, but also a flash EEPROM and other circuits that are operated at different voltage levels may be mixed and implemented in the same substrate to construct a system LSI. Such circuits include interface circuits, gate array circuits, memory circuits such as RAMs and ROMs and RISCs (reduced instruction set computer), or a variety of IP (Intellectual Property) macro circuits, or other digital circuits and analog circuits.

Methods for operating a memory transistor, an embedded semiconductor device in which a semiconductor device according to an embodiment of the present invention is applied, and methods for manufacturing a semiconductor device shown in FIG. 1 will be described below.

For the operation of a memory transistor with a split-gate structure 400 in accordance with certain embodiments of the present invention, a channel current flows between the source 16 and the drain 14 to thereby inject a charge (hot electrons) in the floating gate 40 when data is written. When data is erased, a predetermined high voltage is applied to the control gate 36 to thereby transfer the charge stored in the floating gate 42 to the control gate 36 by the FN conduction. Each of the operations will be described below.

First, an example of a writing operation will be described. For the data-writing operation, the source 16 is set at a higher potential with respect to the drain 14, and a low potential is applied to the control gate 36. As a result, hot electrons that are generated under the floating gate 40 and near the drain 14 are accelerated towards the floating gate 40, and injected in the floating gate 40 through the gate insulation layer 26 to thereby accomplish the data-writing operation.

In the writing operation, for example, the control gate 36 is set at a potential (Vc) of 2 V, the source 16 is set at a potential (Vs) of 9 V, and the drain 14 is set at a potential (Vd) of 0 V. The well 12 is set at a potential (Vwell) of 0 V.

Next, an example of an erasing operation will be described. For the erasing operation, the control gate 36 is set at a potential higher than the potential of the source 16 and the drain 14. As a result, the charge stored in the floating gate 40 is discharged through the sharp upper edge section of the floating gate 40 by the FN tunneling conduction, passing through the intermediate insulation layer 50, to the control gate 36, whereby the data is erased.

In the erasing operation, for example, the control gate 36 is set at a potential (Vc) of 12 V, the source 16 and the drain 14 are set at potentials (Vs) and (Vd) of 0 V. The well 12 is set at a potential (Vwell) of 0 V.

Next, an example of a reading operation will be described. For the reading operation, the drain 14 is set at a higher potential than the source 16, and the control gate 36 is applied with a predetermined potential, whereby a determination is made based on the presence or the absence of a formed channel as to whether or not data is written. More specifically, when a charge is injected in the floating gate 40, the potential of the floating gate 40 becomes low, with the result that a channel is not formed and a drain current does not flow. On the other hand, when the floating gate 40 is not injected with a charge, the floating gate 40 has a high potential, with the result that a channel is formed and a drain current flows. By detecting a current flowing from the drain 14 by a sense amplifier, data in the memory transistor 400 can be read out.

In the reading operation, for example, the control gate 36 is set at a potential (Vc) of 3 V, the source 16 is set at a potential (Vs) of 0 V, and the drain 14 is set at a potential (Vd) of 2 V. The well 12 is set at a potential (Vwell) of 0 V.

The operations described above are examples, and other operation conditions are also applicable in accordance with other embodiments. For example, table 1 below sets forth a range of voltages according to one embodiment for write, erase and read operations.

TABLE 1

Range of voltages for write, erase and read operations according to one embodiment.

|  | control gate (V) | source (V) | drain (V) |
| --- | --- | --- | --- |
| write | 0.5–3 | 8–11 | 0 |
| erase | 10–14 | 0 | 0 |
| read | 1–5 | 0 | 1–5 |

Figure 14:
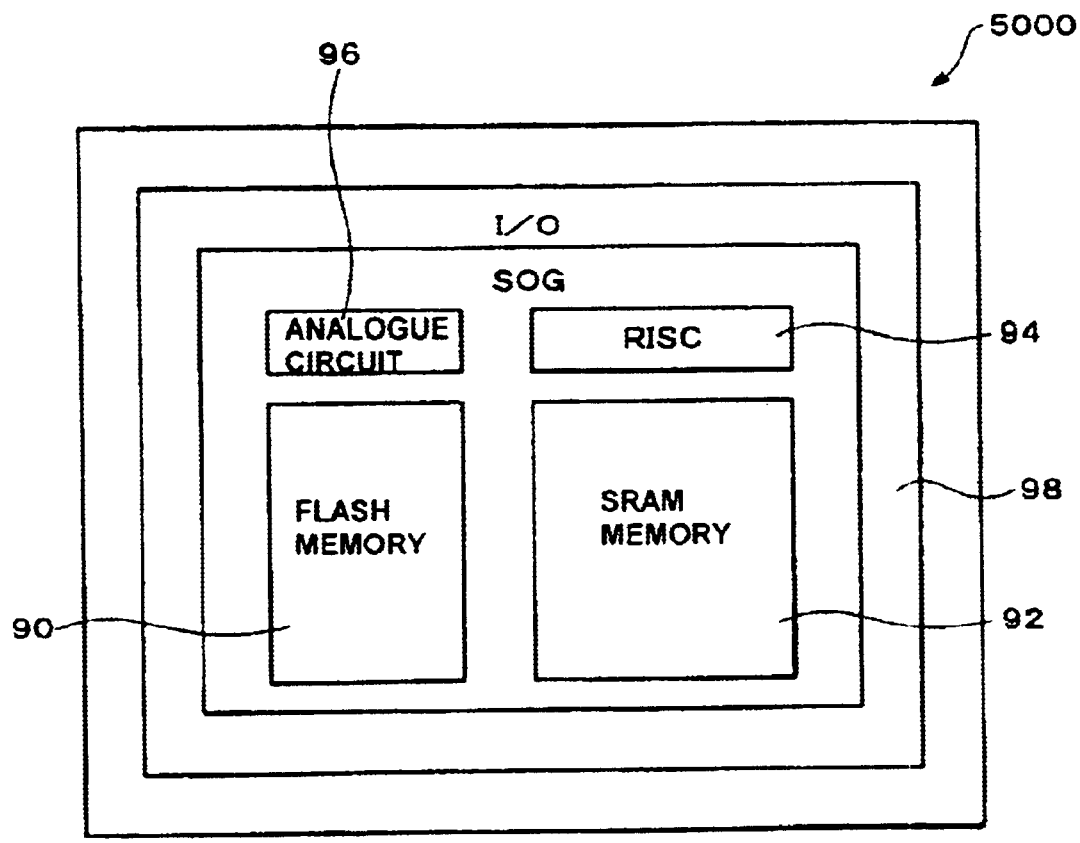
FIG. 14 is a schematic plan view of an embedded semiconductor device employing a semiconductor device in accordance with one embodiment of the present invention.

FIG. 14 schematically shows a layout of an embedded semiconductor device 5000 in which a semiconductor device of an embodiment of the present invention is implemented. In accordance with this embodiment, the embedded semiconductor device 5000 includes a flash-memory (flash EEPROM) 90, an SRAM memory 92, a RISC 94, an analog circuit 96 and an interface circuit 98 that are mixed and mounted in an SOG (sea of gates) structure.

Figure 15:
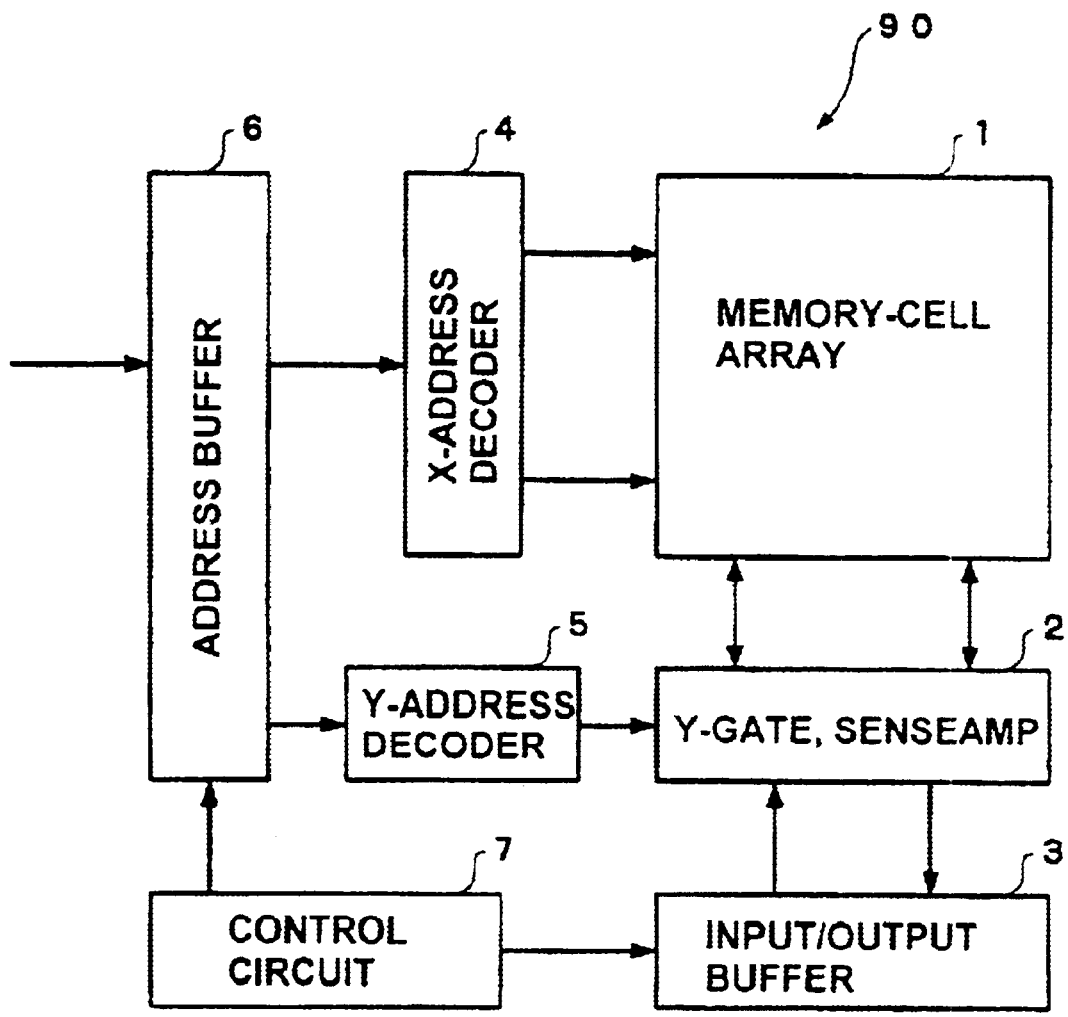
FIG. 15 shows a block diagram of a flash-memory of the embedded semiconductor device shown in FIG. 14.

FIG. 15 shows a block diagram of a structure of a flash-memory. The flash-memory includes a memory cell array 1 in which memory transistors are disposed in an array, a Y-gate, sense amplifier 2, an input/output buffer 3, an X-address decoder 4, a Y-address decoder 5, an address buffer 6 and a control circuit 7.

The memory cell array 1 corresponds to the memory region 4000 shown in FIG. 1 and has a plurality of split-type memory transistors 400 disposed in a matrix. The memory cell array 1 connects to the X-address decoder 4 and the Y-gate 2 in order to select rows and columns of the memory cell array 1. The Y-gate 2 connects to the Y-address decoder 5 that provides column selection data. The X-address decoder 4 and the Y-address decoder 5 connect to the address buffer 6 that temporarily stores address data.

The Y-gate 2 connects to a write-voltage generation circuit (not shown) for conducting a data-wiring operation, and to a sense amplifier for conducting a data-reading operation. The X-address decoder connects to an erasing-voltage generation circuit for conducting a data-erasing operation. The write-voltage generation circuit and the sense amplifier 2 connect to the input/output buffer 3 that temporarily stores input and output data. The address buffer 6 and the input/output buffer 3 connect to the control circuit 7 that controls the operation of the flash-memories. The control circuit 7 performs the control operation based on chip enable signals, output enable signals and program signals.

In the embedded semiconductor device 5000, transistors operable at different voltage levels are selected depending on the operation voltages of the respective circuits.

The first voltage-type transistor 100 that is operated at a first voltage level is included in, for example, at least one of the Y-gate, sense amplifier, the input/output buffer, the X-address decoder, the Y-address decoder, the address buffer, the control circuit, the SOG and the gate array.

The second voltage-type transistor 200 that is operated at a second voltage is included in, for example, at least one of the Y-gate, sense amplifier, the input/output buffer, the X-address decoder, the Y-address decoder and the interface circuit.

The third voltage-type transistor 300 that is operated at a third voltage is included in, for example, at least one of the writing-voltage generation circuit, the erasing-voltage generation circuit and the step-up circuit.

FIG. 14 shows an example of a layout of the embedded semiconductor device 5000. The present invention is applicable to various types of system LSIs.

Next, a method for manufacturing a semiconductor device such as that shown in FIG. 1 in accordance with one embodiment of the present invention will be described with reference to FIGS. 2 through 13.

Figure 2:
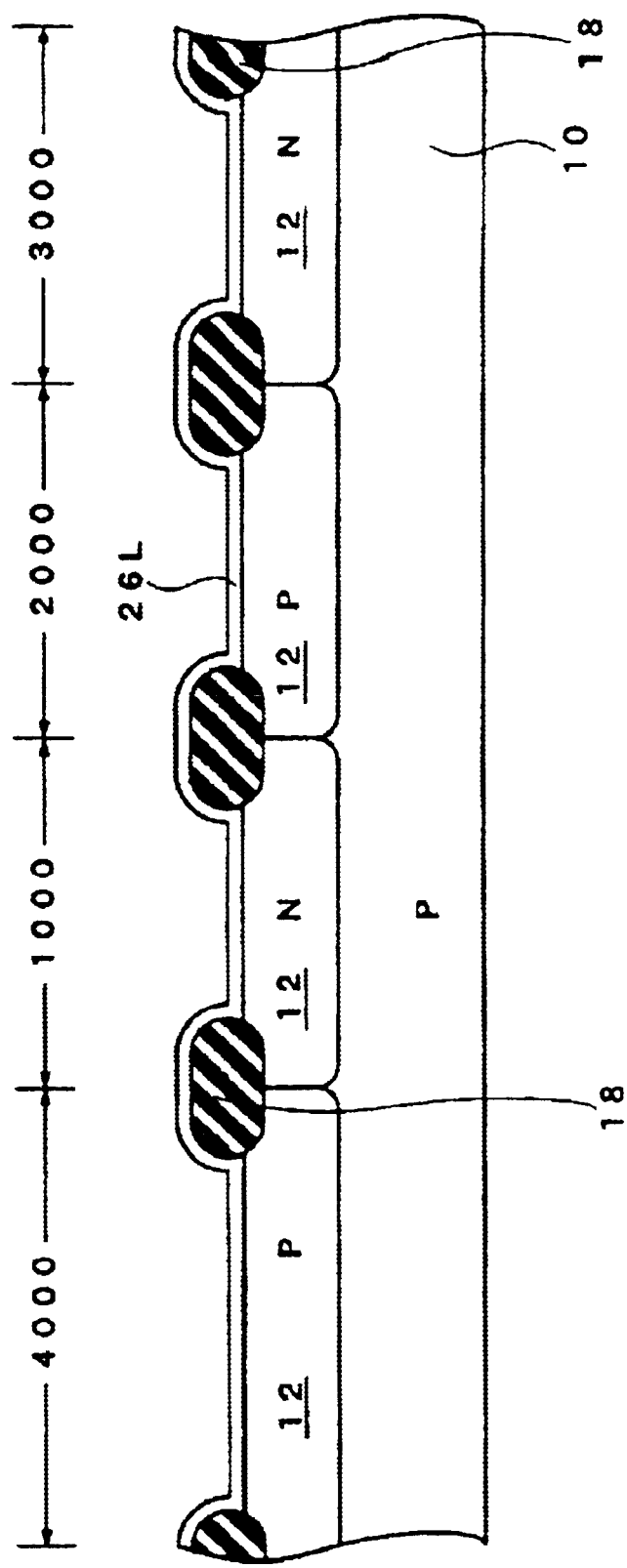
FIGS. 2–13 illustrate cross-sectional views of a wafer during manufacturing for forming the semiconductor device shown in FIG. 1 according to embodiments of the present invention.

(A) First, as shown in FIG. 2, a field insulation layer 18 is formed on the surface of a silicon substrate 10 in a predetermined region thereof by a selective oxidation method. Then, a P-type impurity (for example, boron) or an N-type impurity (for example, arsenic or phosphorous) is doped in the P-type silicon substrate 10 to thereby form a P-type well or an N-type well 12 in a predetermined region of the substrate 10.

Further, a silicon oxide layer 26L is formed on the surface of the silicon substrate 10 by, for example, a thermal oxidation method. The silicon oxide layer 26L becomes a gate insulation layer 26 of the memory transistor 400. The silicon oxide layer 26L may preferably have a thickness of 6–9 nm, in consideration of the gate dielectric strength.

Figure 3:
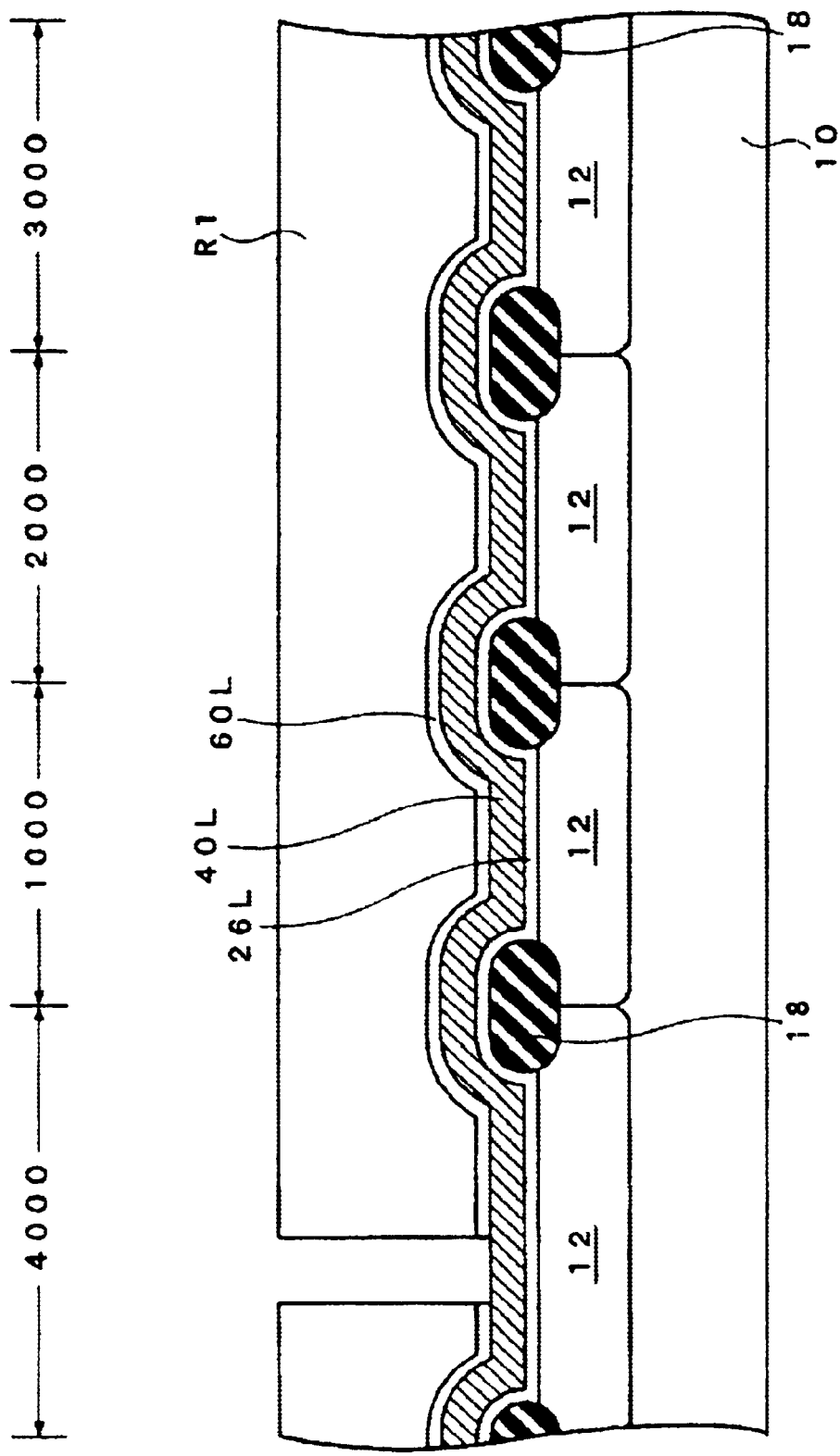

(B) Then, as shown in FIG. 3, a polysilicon layer 40L is formed on the surface of the silicon oxide layer 26L by, for example, a CVD method. The polysilicon layer 40L becomes a floating gate 40 of the memory transistor 400. The polysilicon layer 40L may preferably have a thickness of 100–200 nm.

Then, a first silicon nitride layer 60L is formed on the surface of the polysilicon layer 40L. The first silicon nitride layer 60L may preferably have a thickness of 50–150 nm. Then, the silicon nitride layer 60L is selectively etched, using a resist layer R1 as a mask, to remove a predetermined region thereof. The region of the first silicon nitride layer 60L that is removed corresponds to a region where a selective oxide insulation layer 42 of the memory transistor 400 is formed.

Then, phosphorous or arsenic is diffused in the polysilicon layer 40L, using the resist layer R1 formed on the first silicon nitride layer 60L as a mask, to form an N-type polysilicon layer 40L. The polysilicon layer may be changed to N-type by other methods. For example, after the polysilicon layer is formed, the polysilicon layer is implanted with phosphorous ions or arsenic ions. Alternatively, after the polysilicon layer is formed, the polysilicon layer is contacted with a carrier gas containing phosphoryl chloride POCl$_3$). Alternatively, when the polysilicon layer is formed, the layer is contacted with a carrier gas containing phosphine (PH$_3$).

Then, the resist layer R1 is removed.

Figure 4:
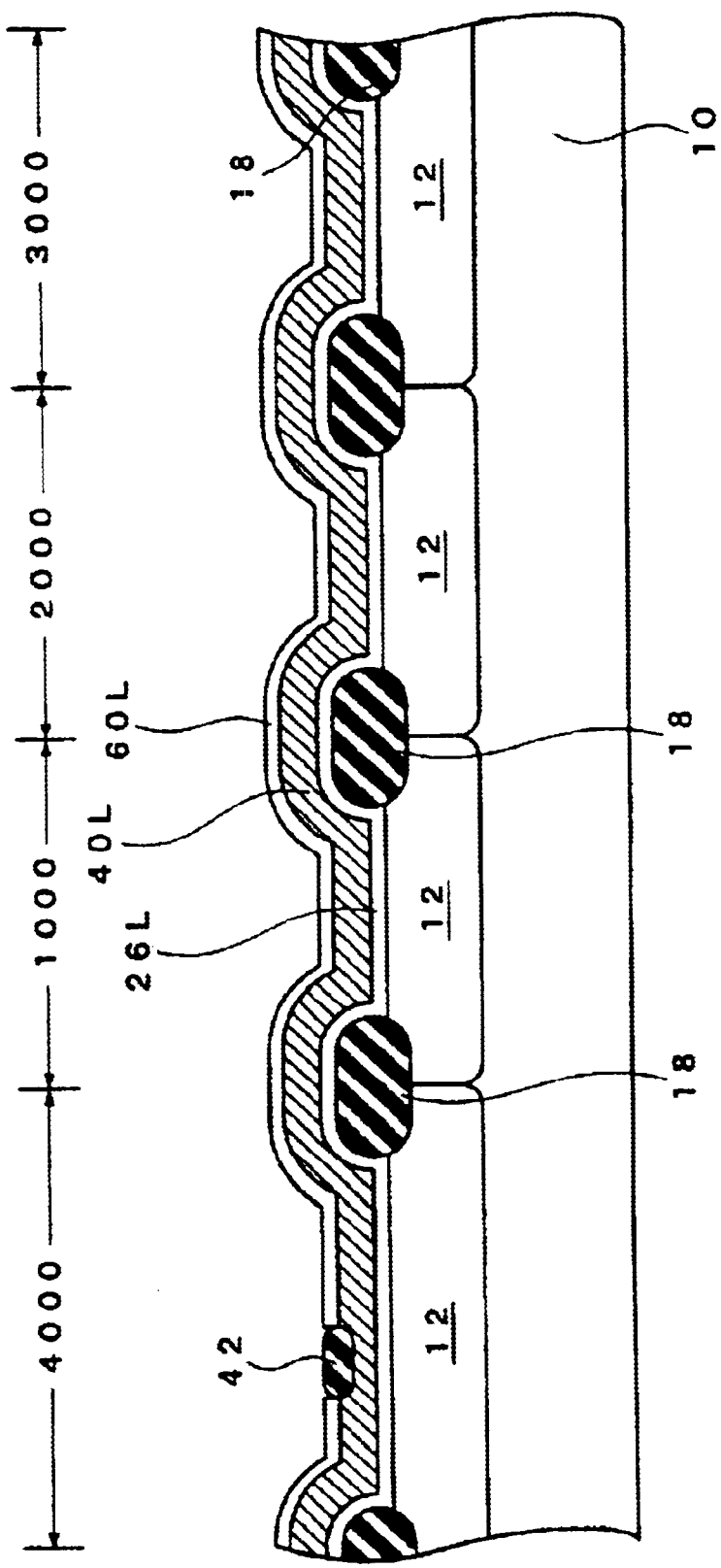

(C) Next, as shown in FIG. 4, an exposed portion in the polysilicon layer 40L is selectively oxidized to form a selective oxide insulation layer 42 on the surface of the polysilicon layer 40L in a predetermined region thereof. The selective oxide insulation layer 42 formed by the selective oxidation preferably has a maximum film thickness at its central area, and gradually becomes thinner toward end sections thereof. The selective oxide insulation layer 42 may preferably have a film thickness of 100–200 nm at the thickest portion. Thereafter, the first silicon nitride layer 60L is removed.

Figure 5:
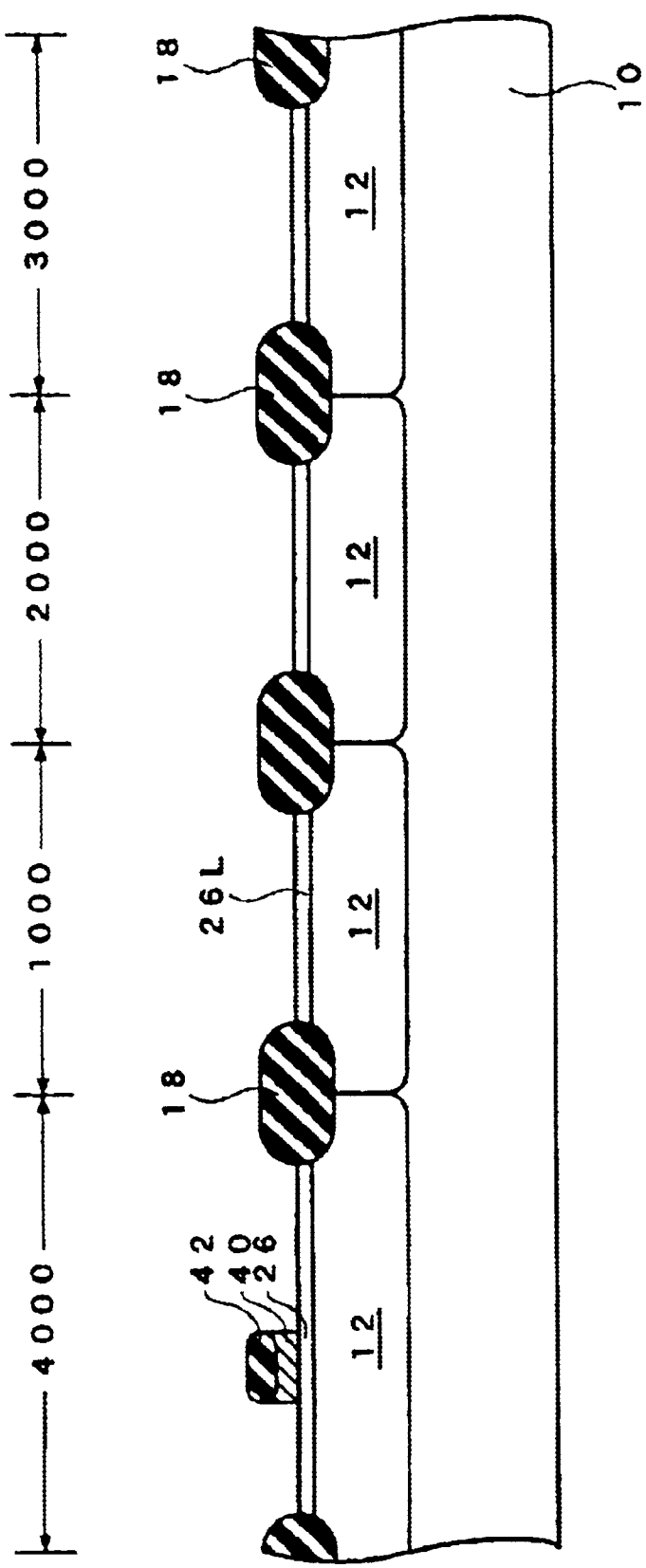

(D) Next, as shown in FIG. 5, an etching is conducted, using the selective oxide insulation layer 42 as a mask, to selectively remove the polysilicon layer 40L.

By the steps described above, the gate insulation layer 26, the floating gate 40 and the selective oxide insulation layer 42 are formed in the memory region 4000.

Figure 6:
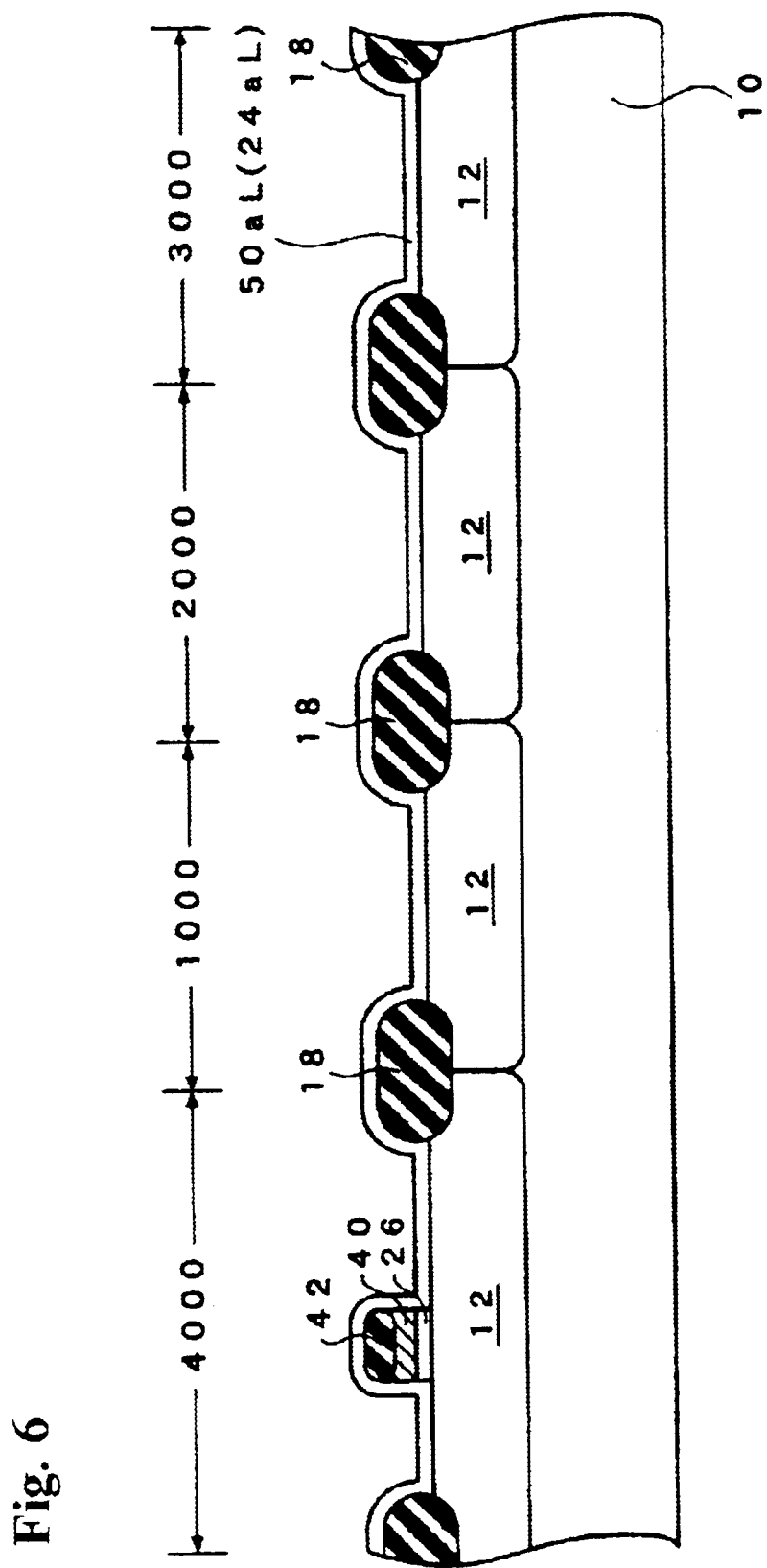

(E) Then, as shown in FIG. 6, the silicon oxide layer 26L is removed by a wet-etching, and then a first silicon oxide layer 50aL (24aL) is formed on the surface of the wafer by a thermal oxidation method. The silicon oxide layer 50aL (24aL) becomes a first insulation layer 50a that forms an intermediate insulation layer 50 of the memory transistor 400, and a first insulation layer 24a that forms a gate insulation layer 24 of the third voltage-type transistor 300. The silicon oxide layer 50aL (24aL) may preferably have a thickness of 5–15 nm, for example.

The silicon oxide layer may preferably be formed by any one of the following thermal oxidation methods:

(a) a dry-oxidation is conducted at 700–1000° C.;
(b) after the dry-oxidation conducted in step (a), a wet-oxidation is further conducted at 700–1000° C.; and
(c) after step (a) or step (b), an anneal treatment is conducted in a nitrogen atmosphere at 700–1000° C. for 10–30 minutes.

By conducting the dry-oxidation in step (a) described above, the size of polysilicon grains on the surface of the floating gate 40 becomes generally uniform, and the planarization of the surface of the floating gate 40 is improved. As a result, the interface state of the floating gate 40 becomes more stabilized, the electron capturing is reduced, and the cycle life of write/erase operations of the memory transistor is extended.

Further, when at least one of the wet-oxidation in step (b) and the anneal treatment in step (c) is added after the dry-oxidation in step (a), the silicon oxide layer 50aL is further densified, and the electron capturing is reduced, such that the film characteristics can be improved.

Figure 7:
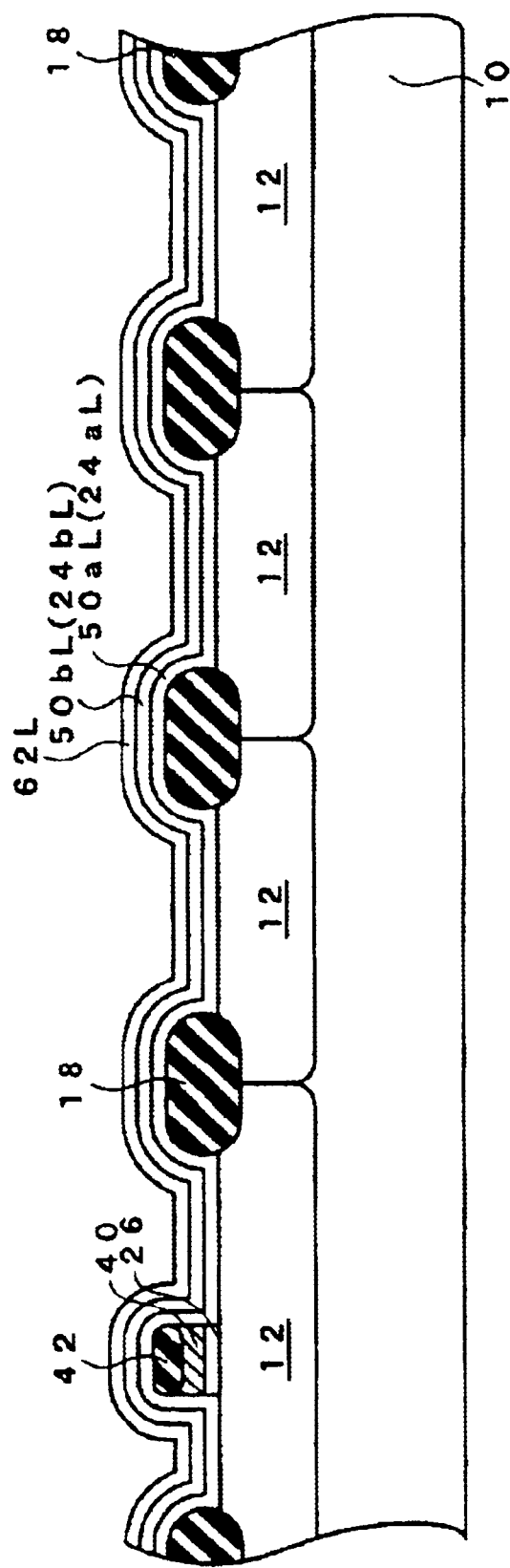

(F) Then, as shown in FIG. 7, a second silicon oxide layer 50bL (24bL) is further formed on the surface of the first silicon oxide layer 50aL (24aL). The second silicon oxide layer 50bL (24bL) is formed by a CVD method. The second silicon oxide layer 50bL (24bL) becomes a second insulation layer 50b that forms an intermediate insulation layer 50 of the memory transistor 400, and a second insulation layer 24b that forms a gate insulation layer 24 of the third voltage-type transistor 300. The silicon insulation layer 50bL (24bL) has a thickness of 10–20 nm, for example.

Considering the density of the formed film, the permeability resistance against oxygen ions and the like in a thermal oxidation to be performed in a later stage, the CVD method used in this embodiment may preferably be conducted by a HTO (high temperature oxide) method, using monosilane or tetraethylorthosilicate, a TEOS (tetraethyl orthosilicate) method, using ozone as an oxidation agent or a plasma TEOS method. A preferred temperature range for an HTO method is about 700–900° C.

Next, a second silicon nitride layer 62L is formed on the surface of the silicon oxide layer 50bL (24bL). The second silicon nitride 62L may preferably have a film thickness of 10–20 nm. Due to the second silicon nitride layer 62L thus formed, although the second silicon nitride layer 62L will be removed in step (I) that is later performed, the intermediate insulation layer 50 of the memory transistor 400 and the gate insulation layer 24 of the third voltage-type transistor 300 do not unnecessarily become thick, and thus the film thickness can be precisely controlled. Then, an anneal treatment may be conducted at 700–1000° C. for about 20–40 minutes to density the insulation layers.

Figure 8:
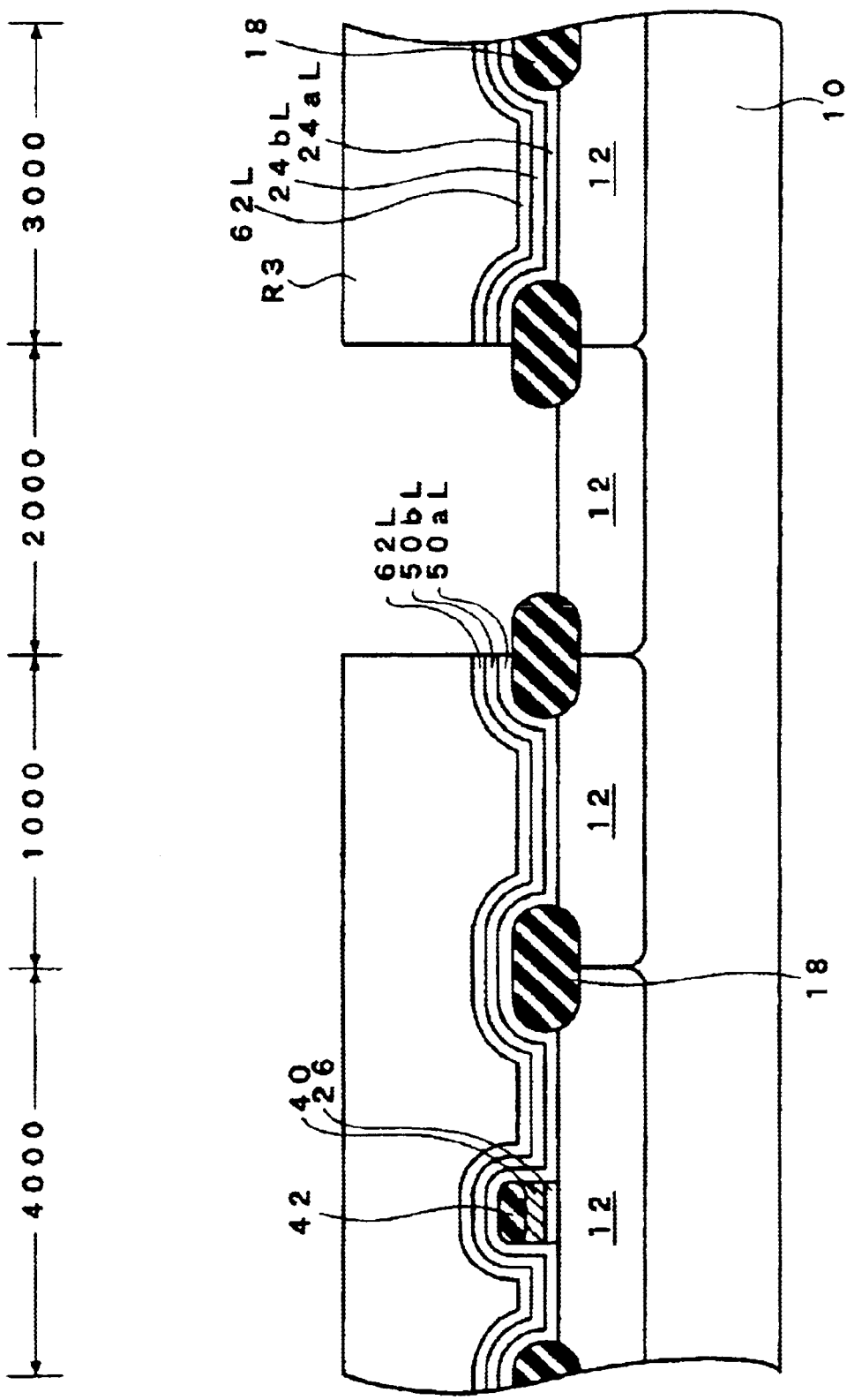

(G) Then, as shown in FIG. 8, a resist layer R3 defining an opening section in the second transistor region 2000 is formed. The second silicon nitride layer 62L, the upper silicon oxide layer 50bL and the lower silicon oxide layer 50aL in the transistor region 2000 may be removed by a dry-etching and a wet-etching, using the resist layer R3 as a mask. Then, the resist layer R3 is removed.

Figure 9:
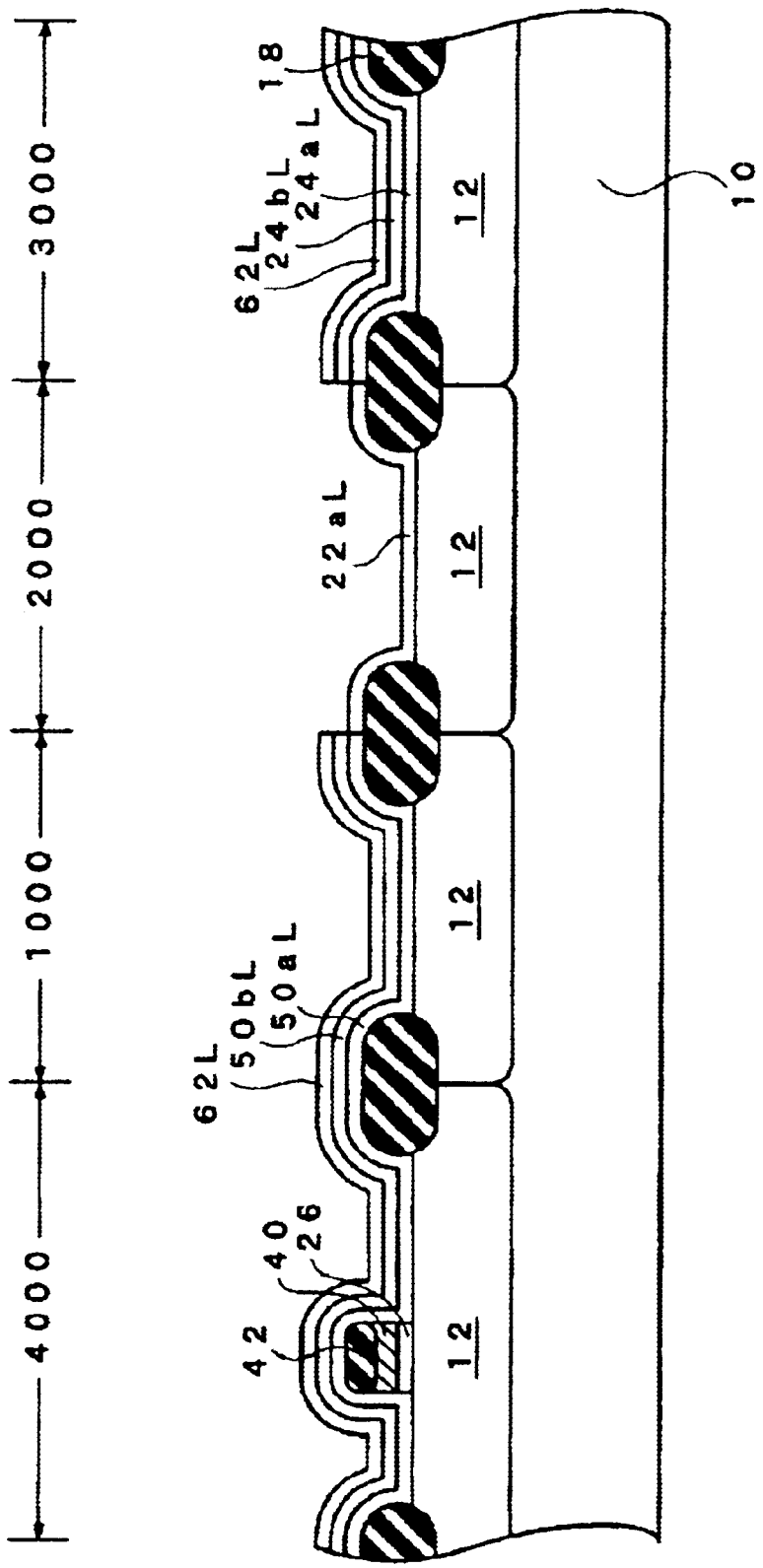

(H) Then, as shown in FIG. 9, the surface of the wafer is subjected to a thermal oxidation, for example, a wet-oxidation at 700–900° C., to thereby form a third silicon oxide layer 22aL on the surface of the wafer. The silicon oxide layer 22aL becomes a first insulation layer 22a that forms the gate insulation layer 22 of the second voltage-type transistor 200. The silicon oxide layer 22aL has a film thickness of 3–15 nm, for example.

Figure 10:
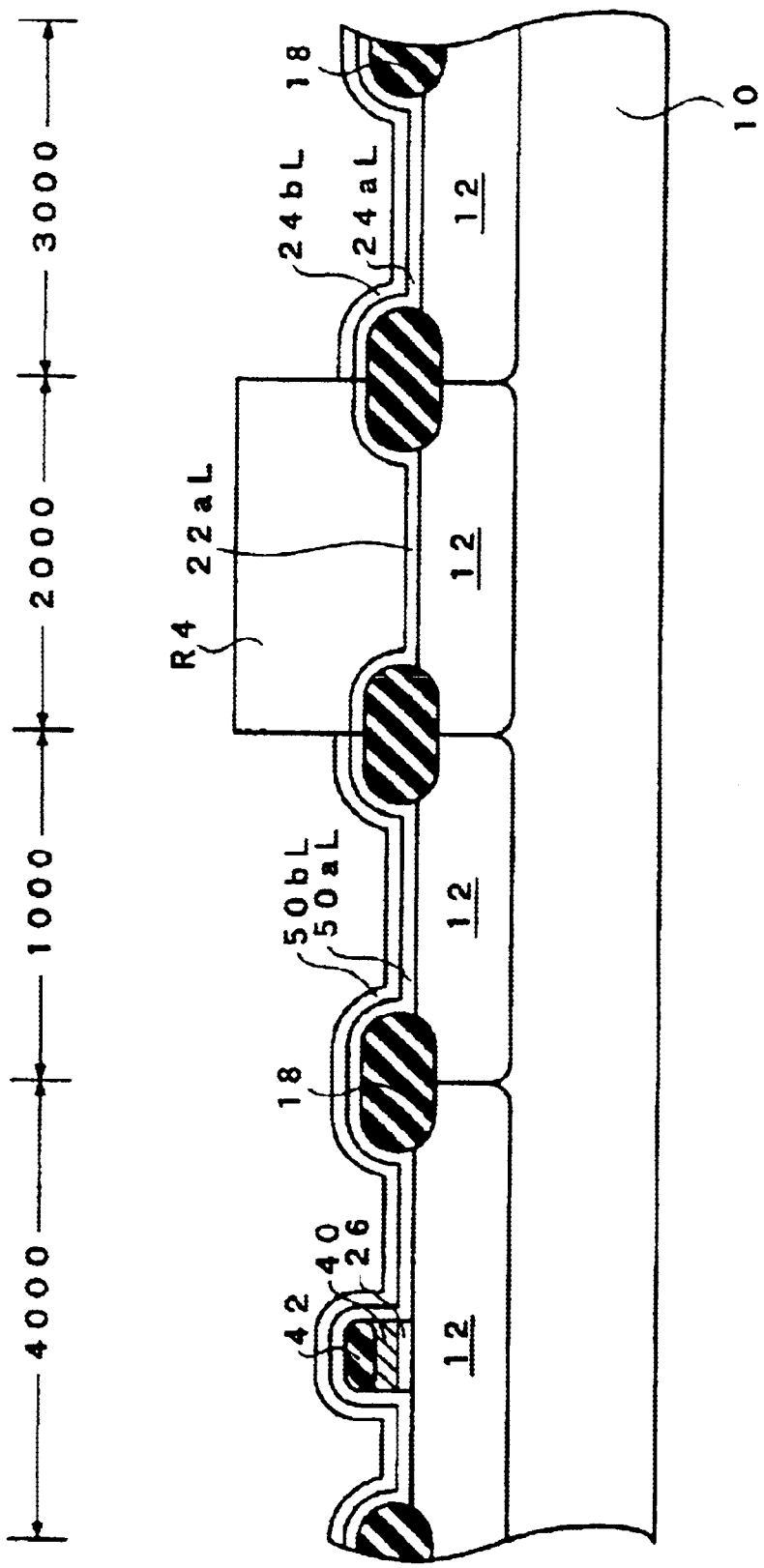

(I) Then, as shown in FIG. 10, a resist layer R4 is formed on the surface of the silicon oxide layer 22aL in the second transistor region 2000. The second silicon nitride layer 62L is removed by a dry-etching, using the resist layer R4 as a mask. Thereafter, the resist layer R4 is removed.

Figure 11:
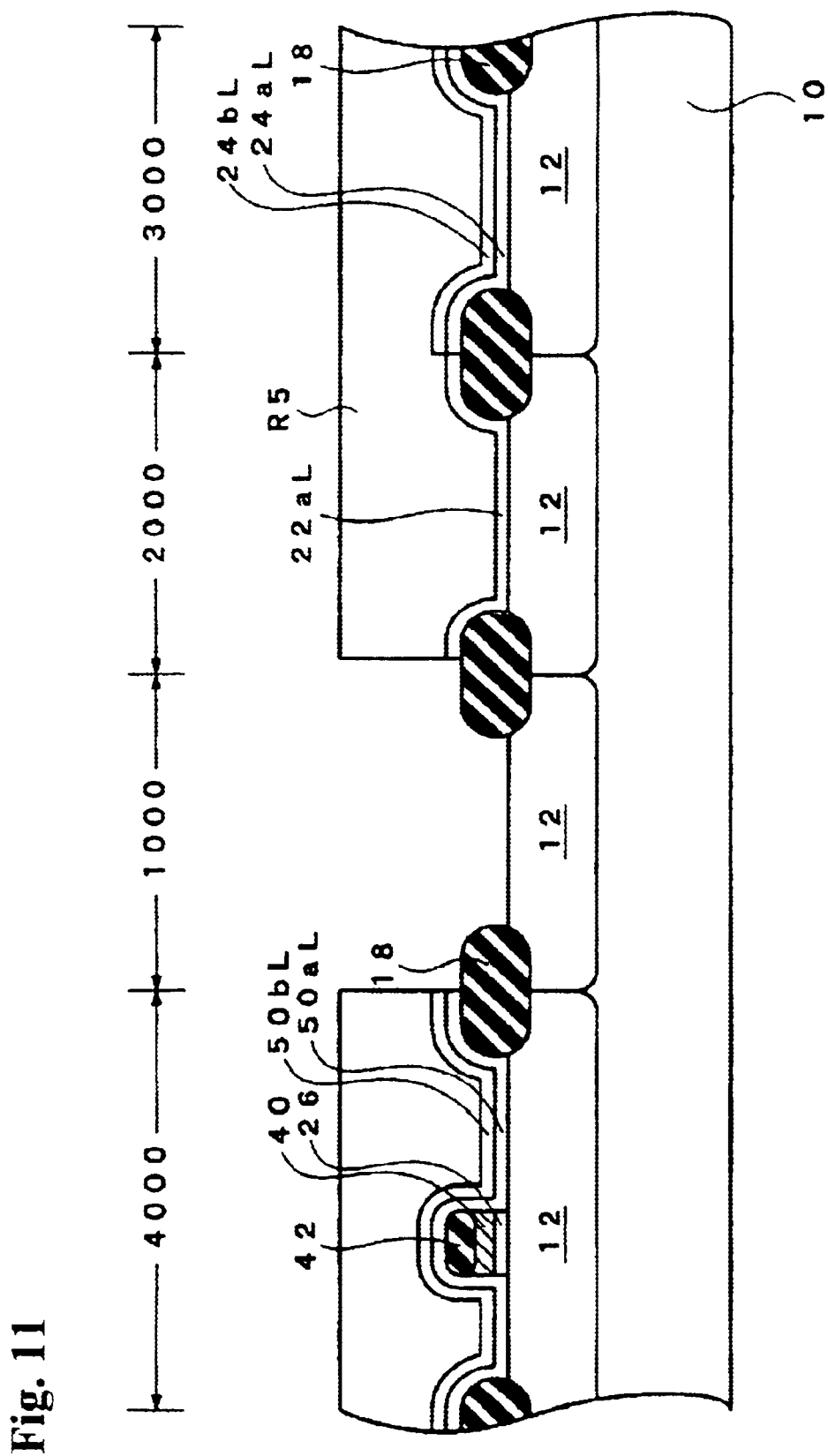

(J) Then, as shown in FIG. 11, a resist layer R5 defining an opening in the first transistor region 1000 is formed. The two silicon oxide layers 50bL and 50aL in the first transistor region 1000 are removed by a wet-etching, using the resist layer R5 as a mask. Then, the resist layer R5 is removed.

Figure 12:
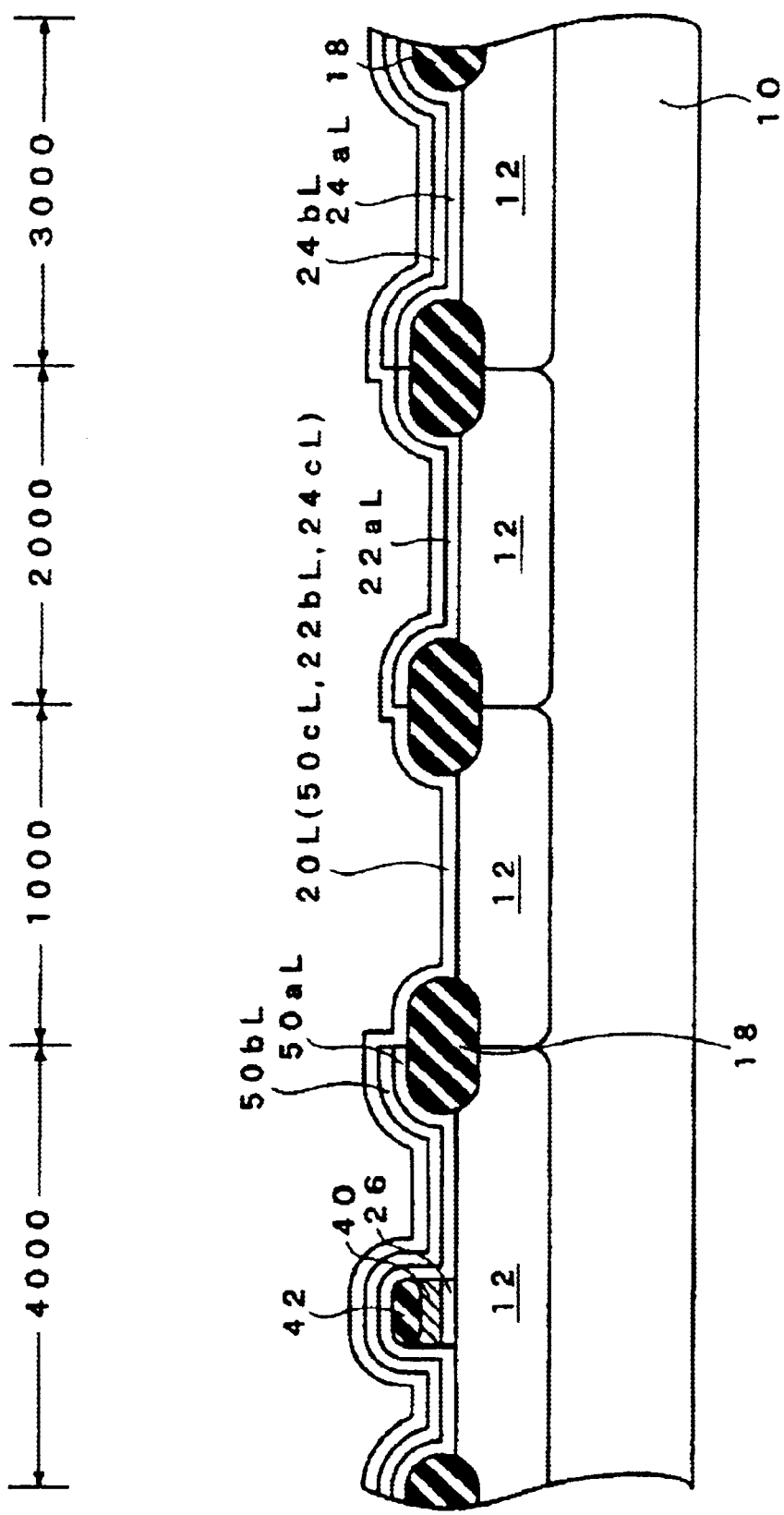

(K) Then, as shown in FIG. 12, the surface of the wafer is subjected to a thermal oxidation, for example, a wet-oxidation conducted at 700–900° C., to form a fourth silicon oxide layer 20L (50cL, 22bL, 24cL) on the surface of the wafer. The silicon oxide layer 20L becomes the gate insulation layer 20 of the first voltage-type transistor 100, the second insulation layer 22b that forms the gate insulation layer 22 of the second voltage-type transistor 200, the third insulation layer 24c that forms the gate insulation layer 24 of the third voltage-type transistor 300, and the third insulation layer 50c that forms the intermediate insulation layer 50 of the memory transistor 400. The silicon oxide layer 20L has a film thickness of 1–10 nm, for example.

The steps described above form the insulation layers that compose the intermediate insulation layer 50 of the memory transistor 400, the gate insulation layer 20 of the first voltage-type transistor 100, the gate insulation layer 22 of the second voltage-type transistor 200 and the gate insulation layer 24 of the third voltage-type transistor 300.

Figure 13:
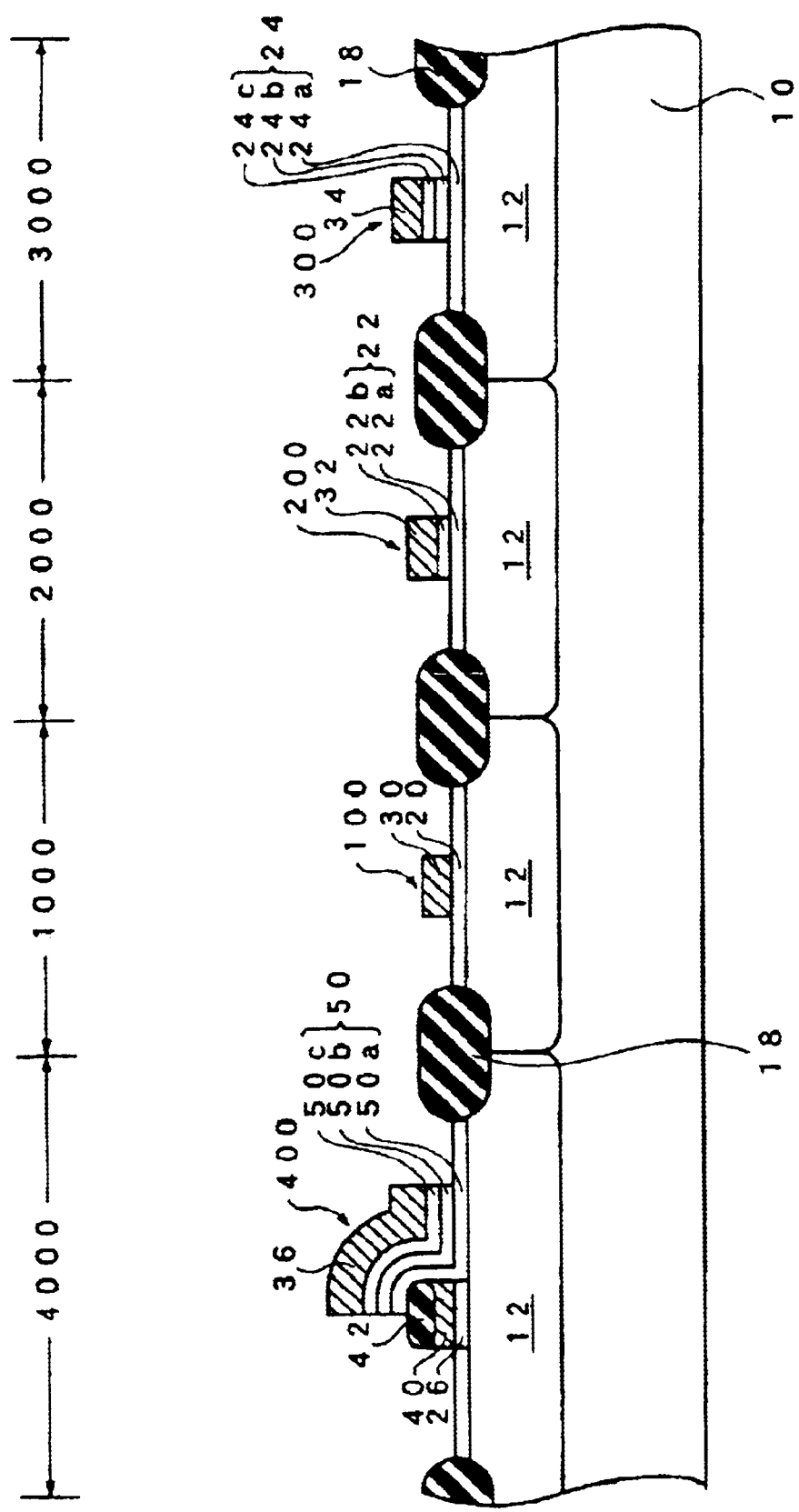

(L) Then, as shown in FIG. 13, a polysilicon layer is formed on the surface of the wafer in the same manner as conducted in step (C) described above. Alternatively, a polycide layer may be formed by a know method, instead of a polysilicon layer. A resist layer having a predetermined pattern is formed on the polysilicon layer, and then a patterning is conducted by an etching to form a gate insulation layer and a gate electrode of each of the memory transistor 400, the first voltage-type transistor 100, the second voltage-type transistor 200 and the third voltage-type transistor 300. In this embodiment, the etching is conducted in a manner that the silicon oxide layer remains to a preferred film thickness of 1–5 nm on exposed surfaces of the silicon substrate 10.

(M) Then, as shown in FIG. 1, an N-type impurity for an N-channel type transistor and a P-type impurity for a P-channel type transistor are doped in predetermined ones of the wells 12 by a known method. As a result, impurity diffusion regions that compose the sources 16 and the drains 14 are formed.

Then, an interlayer dielectric layer 600 that is composed of a silicon oxide layer is formed by, for example, a CVD method on the surface of the wafer on which the transistors 100, 200 and 300 and the memory transistor 400 are formed. Then, the interlayer dielectric layer 600 is selectively etched to remove predetermined regions thereof to define contact holes that reach the sources 16 and the drains 14. Then, a conductive layer composed of an aluminum layer or the like is deposited on the interlayer dielectric layer 600 and in the contact holes by, for example, a sputtering method. The conductive layer is patterned to form metal wiring layers (for example, bit lines and source lines) 80 that electrically connect to the impurity diffusion regions.

In the manufacturing method described above, the memory transistor 400, the first voltage-type transistor 100, the second voltage-type transistor 200 and the third voltage-type transistor 300 are formed in the memory region 4000, the first transistor region 1000, the second transistor region 2000 and the third transistor region 3000. According to this embodiment, a semiconductor device having a memory transistor with a split-gate structure and transistors that operate at at least three different voltage levels mounted therein can be manufactured with fewer manufacturing steps.

In accordance with the manufacturing method embodiment described above, the second insulation layer 22b that forms the gate insulation layer 22 of the second voltage-type transistor 200 is formed in the same step in which the gate insulation layer 20 of the first voltage-type transistor 100 is formed. Similarly, the third insulation layer 24c that forms the gate insulation layer 24 of the third voltage-type transistor 300 and the third insulation layer 50c that forms the intermediate insulation layer 50 of the memory transistor 400 are formed in the same step in which the gate insulation layer 20 of the first voltage-type transistor 100 is formed. Also, the first through the third insulation layers 24a, 24b and 24c that form the gate insulation layer 24 of the third voltage-type transistor 300 are formed in the same steps in which the first through the third insulation layers 50a, 50b and 50c that form the intermediate insulation layer 50 of the memory transistor 400 are formed, respectively. In this manner, the gate insulation layer and the intermediate insulation layer are formed by common steps. As a result, gate insulation layers having different dielectric strengths, in other words, different film thickness, can be formed by fewer steps.

In steps (E) and (F) in the manufacturing method embodiment described above, the, silicon oxide layers 50aL and 50bL that form the first and the second insulation layers 50a and 50b of the intermediate insulation layer (tunnel insulation layer) 50 are formed, and then the second silicon nitride layer 62L is formed. As a result, the silicon oxide layers 50aL and 50bL are covered and protected by the silicon nitride layer 62L in a thermal oxidation that is later conducted or in cleaning steps before or after the thermal oxidation. Any adverse effects of the thermal oxidation step and the cleaning steps on the silicon oxide layers can be inhibited. As a result, a tunnel insulation layer having excellent characteristics can be obtained, and highly reliable memory characteristics can be realized.

Further, while the second silicon nitride layer 62L is formed on the silicon oxide layers 50aL and 50bL, a thermal treatment (including a thermal treatment in an oxidation process) is preferably conducted. As a result, the silicon oxide layers are densified and the film quality of the silicon oxide layers is improved. Thus, the memory characteristics can be improved. In particular, the number of data writing/erasing operations (cycle life) can be extended.

What is claimed:

1. A semiconductor device comprising:
   a memory region including a split-gate non-volatile memory transistor;
   a first transistor region including a first voltage-type transistor that operates at a first voltage level;
   a second transistor region including a second voltage-type transistor that operates at a second voltage level that is different than the first voltage level; and
   a third transistor region including a third voltage-type transistor that operates at a third voltage level that is different than the second voltage level;
   wherein the second voltage-type transistor includes a gate insulation layer formed from at least two insulation layers;
   wherein the non-volatile memory transistor comprises a source, a drain, a gate insulation layer a floating gate, an intermediate insulation layer adapted to function as a tunnel insulation layer, and a control gate, wherein the intermediate insulation layer is formed from at least three insulation layers, wherein a first insulation layer contacts the floating gate and a third insulation layer contacts the control gate; and
   wherein the third voltage-type transistor has a gate insulation layer formed from at least three insulation layers, wherein the at least three insulation layers of the third voltage-type transistor are identical in composition to the at least three insulation layers of tit intermediate insulation layer of the non-volatile memory transistor.

2. A semiconductor device comprising:
   a memory region including a split-gate non-volatile memory transistor;
   a first transistor region including a first voltage-type transistor that operates at a first voltage level;
   a second transistor region including a second voltage-type transistor that operates at a second voltage level that is different than the first voltage level; and
   a third transistor region including a third voltage-type transistor that operates at a third voltage level that is different than the second voltage level;
   wherein the second voltage-type transistor includes a gate insulation layer formed from at least two insulation layers;
   wherein the non-volatile memory transistor comprises a source, a drain, a gate insulation layer, a floating gate, an intermediate insulation layer adapted to function as a tunnel insulation layer, and a control gate, wherein the intermediate insulation layer is formed from at least three insulation layers, wherein a first insulation layer contacts the floating gate and a third insulation layer contacts the control gate;
   wherein the first voltage-type transistor has a gate insulation layer having a thickness that is less than that of the second voltage-type transistor, and the second voltage-type transistor has a gate insulation layer having a thickness that is less than that of the third voltage-type transistor; and
   wherein the non-volatile memory transistor intermediate insulation layer has a thickness that is identical to that of the gate insulation layer of the third voltage-type transistor.

3. A semiconductor device comprising:
   a memory region including a split-gate non-volatile memory transistor;
   a first transistor region including a first voltage-type transistor that operates at a first voltage level;
   a second transistor region including a second voltage-type transistor that operates at a second voltage level that is different than the first voltage level; and
   a third transistor region including a third voltage-type transistor that operates at a third voltage level that is different than the second voltage level;
   wherein the second voltage-type transistor includes a gate insulation layer formed from at least two insulation layers;
   wherein the non-volatile memory transistor comprises a source, a drain, a gate insulation layer, a floating gate, an intermediate insulation layer adapted to function as a tunnel insulation layer, and a control gate wherein the intermediate insulation layer is formed from at least three insulation layers, wherein a first insulation layer contacts the floating gate and a third insulation layer contacts the control gate;
   wherein the first voltage-type transistor has a gate insulation layer having a thickness that is less than that of the second voltage-type transistor, and the second voltage-type transistor has a gate insulation layer having a thickness that is less than that of the third voltage-type transistor; and
   wherein the first voltage-type transistor is positioned adjacent to the non-volatile memory transistor, the second voltage-type transistor is positioned adjacent to the first voltage-type transistor, and the third voltage-type transistor is positioned adjacent to the second voltage-type transistor, wherein the first voltage-type transistor is positioned between the second voltage-type transistor and the non-volatile memory transistor, and wherein the second voltage-type transistor is positioned between the third voltage-type transistor and the first voltage-type transistor.

4. A semiconductor device comprising:
   a memory region including a split-gate non-volatile memory transistor;
   a first transistor region including a first voltage-type transistor that operates at a first voltage level;
   a second transistor region including a second voltage-type transistor that operates at a second voltage level at is different than the first voltage level; and
   a third transistor region including a third voltage-type transistor that operates at a third voltage level that is different than the second voltage level;
   wherein the second voltage-type transistor includes a gate insulation layer formed from at least two insulation layers;
   wherein the non-volatile memory transistor comprises a source, a drain, a gate insulation layer, a floating gate, an intermediate insulation layer adapted to function as a tunnel insulation layer, and a control gate, wherein the intermediate insulation layer is formed from at least three insulation layers, wherein a first insulation layer contacts the floating gate and a third insulation layer contacts the control gate;
   wherein the first voltage-type transistor operates at a lower voltage range than that of the second voltage-type transistor, and the second voltage-type transistor operates at a lower voltage range than that of the third voltage-type transistor; and wherein the first voltage-type transistor is positioned adjacent to the non-volatile memory transistor, the second voltage-type transistor is positioned adjacent to the first voltage-type transistor, and the third voltage-type transistor is positioned adjacent to the second voltage-type transistor, wherein the first voltage-type transistor is positioned between the second voltage-type transistor and the non-volatile memory transistor, and wherein the second voltage-type transistor is positioned between the third voltage-type transistor and the first voltage-type transistor.

5. A semiconductor device as in claim 1, wherein the first voltage-type transistor includes a gate insulation layer having a first thickness, the second voltage-type transistor includes the gate insulation layer formed from at least two insulation layers, the gate insulation layer of the second voltage-type transistor having a second thickness, and the third voltage-type transistor includes the gate insulation layer formed from at least three insulation layers, the gate insulation layer of the third voltage-type transistor having a third thickness, wherein the second thickness is greater than the first thickness and the third thickness is greater than the second thickness.

6. A semiconductor device according to claim 1, wherein:

the first voltage-type transistor includes a gate insulation layer having a thickness of 3–13 nm, the gate insulation layer or the second voltage-type transistor has a thickness of 4–15 nm, and the gate insulation layer of third voltage-type transistor has a thickness of 16–45 nm.

7. A semiconductor device according to claim 6, wherein the intermediate insulation layer of the non-volatile memory transistor has a thickness of 16–45 nm.

8. A semiconductor device according to claim 1, wherein the gate insulation layer of the third voltage-type transistor has a thickness that is equal to that of the intermediate insulation layer of the non-volatile memory transistor.

9. A semiconductor device according to claim 1, further comprising a selective oxidation layer on an upper surface of the floating gate, wherein the intermediate insulation layer of the non-volatile memory transistor extends over a portion of the selective oxidation layer.

10. A semiconductor device according to claim 1, wherein the first voltage-type transistor is included in at least one circuit selected from a group consisting of a Y-gate sense amplifier, an input/output buffer, an X-address decoder, a Y-address decoder, an address buffer and a control circuit.

11. A semiconductor device according to claim 1, wherein the second voltage-type transistor is included in at least one circuit selected from a group consisting of a Y-gate sense amplifier, an input/output buffer, an X-address decoder, a Y-address decoder and an interface circuit.

12. A semiconductor device according to claim 1, wherein the third voltage-type transistor is included in at least one circuit selected from a soup consisting of a voltage generation circuit, an erase voltage generation circuit and a step-up voltage circuit.

13. A semiconductor device as in claim 1, wherein the first voltage level that operates the first voltage-type transistor is in a range of 1.8–3.3 V, the second voltage level that operates the second voltage-type transistor is in a range of 2.5–5 V, and the third voltage level that operates the third voltage-type transistor is in a range of 10–15 V.

14. A semiconductor device according to claim 1, wherein the gate insulation layer of the third voltage-type transistor is formed from three insulation layers, including a lower layer having a thickness of 5–15 nm, a middle layer, and an upper layer having a thickness of 1–10 nm.

15. A semiconductor device according to claim 2, further comprising a selective oxidation layer on an upper surface of the floating gate, wherein the intermediate insulation layer of the non-volatile memory transistor extends over a portion of the selective oxidation layer.

16. A semiconductor device according to claim 15, wherein:

the gate insulation layer of the second voltage-type transistor has a thickness of 4–15 nm, and the gate insulation layer of third voltage-type transistor has a thickness of 16–45 nm.

17. A semiconductor device as in claim 15, wherein the second voltage level that operates the second voltage-type transistor is in a range of 2.5–5 V, and the third voltage level that operates the third voltage-type transistor is in a range of 10–15 V.

18. A semiconductor device according to claim 15, wherein the gate insulation layer of the third voltage-type transistor is formed from three insulation layers, including a lower layer having a thickness of 5–15 nm, a middle layer, and an upper layer having a thickness of 1–10 nm.

19. A semiconductor device according to claim 3, further comprising a selective oxidation layer on an upper surface of the floating gate, wherein the intermediate insulation layer of the non-volatile memory transistor extends over a portion of the selective oxidation layer.

20. A semiconductor device according to claim 3, wherein:

the gate insulation layer of the second voltage-type transistor has a thickness of 4–15 nm, and the gate insulation layer of third voltage-type transistor has a thickness, of 16–45 nm.

21. A semiconductor device as in claim 3, wherein the second voltage level that operates the second voltage-type transistor is in a range of 2.5–5 V, and the third voltage level that operates the third voltage-type transistor is in a range of 10–15 V.

22. A semiconductor device according to claim 3, wherein the gate insulation layer or the third voltage-type transistor is formed from three insulation layers, including a lower layer having a thickness of 5–15 nm, a middle layer, and an upper layer having a thickness of 1–10 nm.

23. A semiconductor device according to claim 4, further comprising a selective oxidation layer on an upper surface of the floating gate, wherein the intermediate insulation layer of the non-volatile memory transistor extends over a portion of the selective oxidation layer.

24. A semiconductor device according to claim 23, wherein:

the gate insulation layer of the second voltage-type transistor has a thickness of 4–15 nm, and the gate insulation layer of third voltage-type transistor has a thickness of 16–45 nm.

25. A semiconductor device as in claim 23, wherein the second voltage level that operates the second voltage-type transistor is in a range of 2.5–5 V, and the third voltage level that operates the third voltage-type transistor is in a range of 10–15 V.

26. A semiconductor device according to claim 23, wherein the gate insulation layer of the third voltage-type transistor is formed from three insulation layers, including a lower layer having a thickness of 5–15 nm, a middle layer, and an upper layer having a thickness of 1–10 nm.

27. A semiconductor device comprising a memory region, first, second and third transistor regions including field effect transistors, the memory region including a split-gate non-volatile memory transistor comprising a source, a drain, a gate insulation layer, a floating gate formed on the gate insulation layer, a selective oxide insulation layer formed on the floating gate, an intermediate insulation layer adapted to function as a tunnel insulation layer, wherein a portion of the intermediate insulation layer extends on the selective oxide insulation layer, and a control gate formed on the intermediate insulation layer, wherein the intermediate insulation layer is formed from at least three insulation layers, the first transistor region including a first voltage-type transistor that operates at a first voltage range, the second transistor region including a second voltage-type transistor that operates at a second voltage range, and the third transistor region including a third voltage-type transistor that operates at a third voltage range that is higher than the first and second voltage levels, wherein the third voltage-type transistor includes a gate insulation layer formed from at least three insulation layers, wherein the at least three insulation layers of the third voltage-type transistor are identical in composition to the at least three insulation layers of the intermediate insulation layer of the non-volatile memory transistor.

28. A semiconductor device according to claim 27, wherein the at least three insulation layers of the third voltage-type transistor include upper and lower thermally oxidized layers separated from one another by another insulating layer.

29. A semiconductor device according to claim 28, wherein the upper thermally oxidized layer comprises silicon oxide, the lower thermally oxidized layer comprises silicon oxide, and the insulating layer separating the upper and lower thermally oxidized layers from one another comprises silicon oxide.

* * * * *